(12) United States Patent
Wits et al.

(10) Patent No.: US 9,534,819 B2
(45) Date of Patent: Jan. 3, 2017

(54) SYSTEM FOR FAST AND ACCURATE FILLING OF A TWO-PHASE COOLING DEVICE, NOTABLY A HEAT PIPE, ADAPTED FOR USE IN AN AUTOMATED PROCESS

(71) Applicant: Thales Nederland B.V., Hengelo (NL)

(72) Inventors: Wessel Willems Wits, Zwolle (NL); Harm Jan Ten Hoeve, Marknesse (NL); Gerhardus Wilhelmus Te Riele, Enschede (NL); Johannes Van Es, Zwolle (NL)

(73) Assignee: THALES NEDERLAND B.V., Hengelo (NL)

( * ) Notice: Subject to any disclaimer, the term of this patent is extended or adjusted under 35 U.S.C. 154(b) by 34 days.

(21) Appl. No.: 14/350,408

(22) PCT Filed: Oct. 10, 2012

(86) PCT No.: PCT/EP2012/070064
§ 371 (c)(1),
(2) Date: Apr. 8, 2014

(87) PCT Pub. No.: WO2013/057025
PCT Pub. Date: Apr. 25, 2013

(65) Prior Publication Data
US 2014/0318169 A1 Oct. 30, 2014

(30) Foreign Application Priority Data
Oct. 21, 2011 (EP) .................................. 11186242

(51) Int. Cl.
*F25B 45/00* (2006.01)
*F28D 15/02* (2006.01)
(Continued)

(52) U.S. Cl.
CPC ............ *F25B 45/00* (2013.01); *F28D 15/0283* (2013.01); *F28D 15/04* (2013.01); *H05K 1/0272* (2013.01);
(Continued)

(58) Field of Classification Search
CPC .. F25B 45/00; F25B 2345/002; F25D 15/0258
(Continued)

(56) References Cited

U.S. PATENT DOCUMENTS

| 4,341,000 A * | 7/1982 | Stockman | B23P 15/26 |
| | | | 165/104.27 |
| 4,586,561 A * | 5/1986 | Franco | C01C 1/024 |
| | | | 165/104.27 |

(Continued)

FOREIGN PATENT DOCUMENTS

| DE | 4217965 | 5/1993 |
| DE | 602004002178 | 7/2007 |

OTHER PUBLICATIONS

International Search Report and Written Opinion for PCT/EP2012/070064 dated Nov. 21, 2012.
(Continued)

*Primary Examiner* — Melvin Jones
(74) *Attorney, Agent, or Firm* — Snell & Wilmer L.L.P.

(57) ABSTRACT

The current invention relates to a system for fast and accurate filling of a two-phase cooling device, comprising a binding device (30) intended to be hermetically mounted onto the cooling device, the binding device (30) comprising a through-hole (32) able to be in fluid contact with the cooling device, said through-hole (32) being extending between a lower surface adapted to the cooling device's surface, and an essentially plane upper surface, the binding device (30) further comprising a gripping head essentially level with said upper surface, allowing for a filling tool (400)
(Continued)

Figure 1:
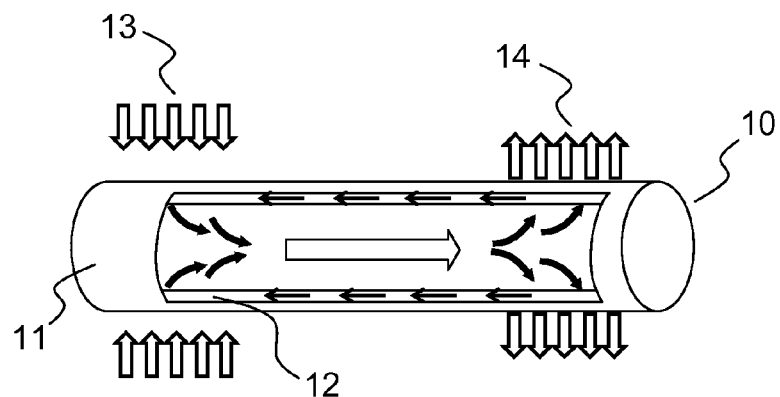

to be put in hermetic contact with said upper surface. In a preferred embodiment, the through-hole (32) can be hermetically sealed by forced insertion of a pin-shaped plug (33). The invention also relates to the filling tool (400) to be used in combination with the binding device (30), allowing gas removal from the cooling device, filling of a working fluid, and hermetic sealing of the cooling device. The invention also relates to the high accuracy of filling by using zero dead volume valves. The binding device (30) is notably particularly well adapted for use in an automated process.

19 Claims, 6 Drawing Sheets

(51) Int. Cl.
   *H05K 1/02*     (2006.01)
   *F28D 15/04*    (2006.01)
(52) U.S. Cl.
   CPC ......... *F25B 2345/00* (2013.01); *H05K 1/0203* (2013.01); *H05K 2201/064* (2013.01)

(58) Field of Classification Search
   USPC ............ 62/292, 149, 77; 165/104.26, 104.27
   See application file for complete search history.

(56) References Cited

U.S. PATENT DOCUMENTS

| | | | |
|---|---|---|---|
| 4,930,550 A * | 6/1990 | Czerwinski | ............. F23K 5/002 137/334 |
| 5,467,806 A | 11/1995 | Stricklin et al. | |
| 5,895,868 A | 4/1999 | Giammaruti | |
| 2006/0213062 A1 | 9/2006 | Lin | |
| 2007/0102138 A1 | 5/2007 | Kadota | |
| 2009/0025415 A1 | 1/2009 | Kung | |
| 2010/0008043 A1 | 1/2010 | Yajima | |

OTHER PUBLICATIONS

Communication Pursuant to Article 94(3) EPC dated Oct. 16, 2015 in European Application No. 12768685.4.

\* cited by examiner

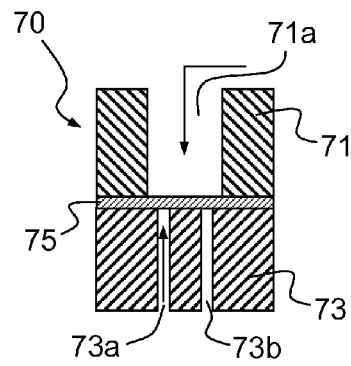
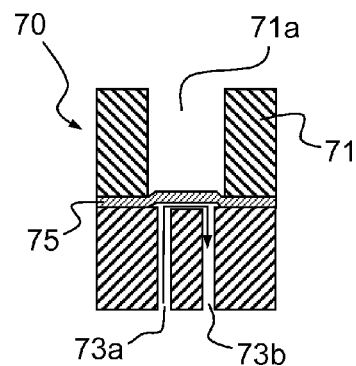
FIG.7a    FIG.7b
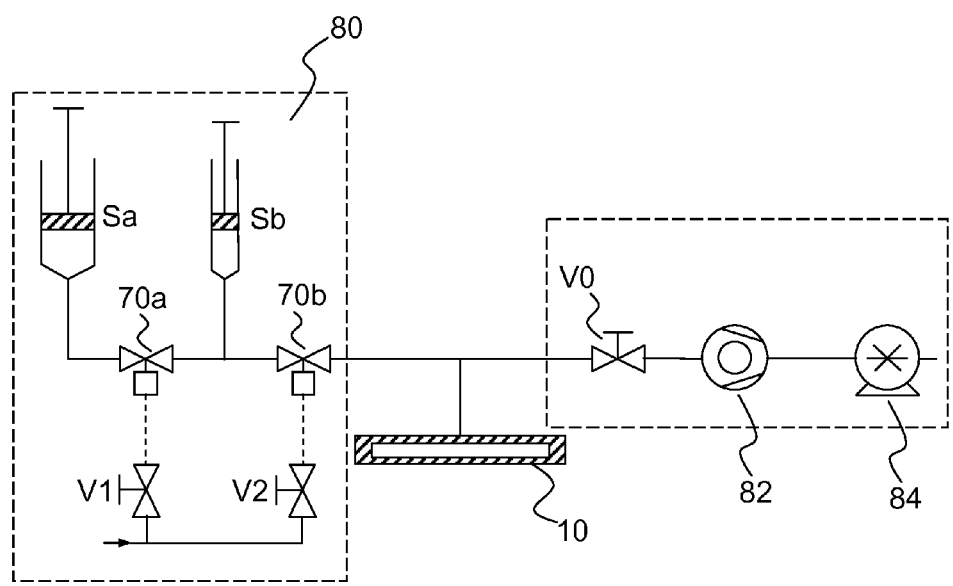
FIG.8

SYSTEM FOR FAST AND ACCURATE FILLING OF A TWO-PHASE COOLING DEVICE, NOTABLY A HEAT PIPE, ADAPTED FOR USE IN AN AUTOMATED PROCESS

CROSS-REFERENCE TO RELATED APPLICATIONS

This application is a U.S. national phase filing under 35 U.S.C. §371 of PCT/EP2012/070064 filed Oct. 10, 2012 and claims priority from EP Application No. 11186242.1 which was filed on Oct. 21,2011, all of which are incorporated herein by reference in their entirety.

The current invention relates to a system for fast and accurate filling of a two-phase cooling device such as a heat pipe, notably adapted for use in an automated process. A two-phase cooling device involves a fluid present under two phases, typically liquid and gas phases. The current invention more particularly applies to thermal management of electronic circuits, and is more specifically related to cooling of printed circuit boards using an integrated heat pipe.

In electronic devices notably, the amount of dissipated heat per unit of surface area tends to rise up as a function of continuously increasing performances and functionalities of semiconductors. Therefore, controlling rising temperatures in electronic devices is a concern. According to an already known technique, heat pipes can be resorted to. Heat pipes allow delivering high thermal management performances, with a relatively small form factor, and with the advantage of operating in a fully passive mode, that is: without the need for a power source. Known heat pipes are usually composed of a tubular structure containing a working fluid or coolant circulating therethrough, the structure being arranged so that one of its ends comes in vicinity with heat dissipating components. Heat pipes can also have more complex structures.

For instance, according to an advantageous technique already known in the art, a heat pipe can be integrated within the structure of a printed circuit board, hereinafter referred to as "PCB". Such a technique is described in the international patent application published under the reference WO 2007/096313.

In order for a heat pipe to operate under optimal conditions, it is necessary that the volume of the working fluid it contains shall be adjusted with a maximal accuracy. For the purpose of maximizing said accuracy, it has been proposed that the filling of a heat pipe with its working fluid be carried out through at least three phases. One first phase of the heat pipe filling process consists of removing all gases initially contained within the heat pipe, said gasses being for example comprising air, carbon dioxide, etc. Such a first phase can notably rely on the use of valves, and is described in details hereafter, in reference to FIG. 2.

Then a second phase consists of actually filling the heat pipe with the working fluid. The second phase is followed by a third phase which consists of hermetically sealing the heat pipe, so that the working fluid it contains cannot leak from the heat pipe and reciprocally so that external gases, such as for example ambient air, cannot enter the heat pipe. The third phase can be accomplished through pinching off the extremity of the tubular structure forming the heat pipe, through which the gas removal and the filling phases have been performed. The amount of working fluid to be contained within the heat pipe is predetermined, and notably depends on the geometry of the heat pipe and its internal structure. If the amount of working fluid is too small, it may result in dry-out of the evaporator part of the heat pipe, causing heat pipe failure. On the contrary, if the amount of working fluid is too high, then overfilling may flood the condenser part of the heat pipe, resulting in a loss of performance of the latter. Therefore accuracy of the filling phase is a key element for successfully charging a two-phase cooling device.

According to filling techniques already known in the art, the working fluid may be injected in the heat pipe in a liquid phase. One advantage of filling the heat pipe via the liquid phase of the working fluid lies in that it allows a faster filling phase, therefore applicable as part of an industrial process adapted for series production. However, this technique makes it more difficult to attain a fine accuracy as to the quantity of working fluid, due to the larger density of the fluid in its liquid phase. The dead volumes of the used filling structure and associated valves determine the filling accuracy.

Such negative effects can be palliated by using vapour filling methods, in which the working fluid is injected in its gazous phase, and can be distilled into the heat pipe. A vapour filling method allows attaining a much higher filling accuracy, due to the lower density of the working fluid in its vapour phase. However, such a method takes much a longer time to be carried out, which renders its use unsuitable for series production. Moreover, such a method requires that a liquid container be heated for the purpose of vaporating the working fluid, which renders the filling process less efficient and more costly. Therefore a relevant trade-off shall be found, between a fast-enough filling phase, and a reliable-enough hermetic seal.

Following any of the methods described above, a large opening of the heat pipe is required, in order to allow a fast gas removal and working fluid filling process. On the contrary, a smaller opening shall be preferred for allowing a faster and more efficient sealing process. Therefore a relevant trade-off shall be found, between a large-enough opening for favoring gas removal, and a small-enough opening for favoring sealing. When a heat pipe is formed by a simple cylindrical tubular shape, the gas removal and filling phases can for example be accomplished through an end thereof, which can be pinched off once these phases are completed. When a heat pipe is formed by a more complex structure, for example when it is essentially of planar shape, or integrated in a PCB, a smaller tube can be connected to the heat pipe, and be used for gas removal and filling phases. This tube is intended to facilitate gas removal and filling, and can be pinched off from the outside using an appropriate tool once these phases are accomplished. This tube can for example be made of a soft metal, for example copper, brass or nickel. Prior to the filling phase, this tube needs to be connected, for example through soldering, to the heat pipe, which represents a drawback not only in terms of manufacturing cost, but also on an assembly perspective: especially in the field of electronics manufacturing, where components shall be positioned and soldered onto the board automatically.

One other drawback of the known techniques described above, is that after the filling phase, a piece of tube is remaining, usually protruding from the finished product, which adds ergonomics and handling difficulties. It shall be observed here that if some part of the tube suffers from leaking, due to bending or to an external impact, then the heat pipe loses its hermetical seal and its performance is inevitably dramatically impacted.

One aim of the current invention is to palliate at least the above mentioned drawbacks that are inherent to existing techniques, by proposing a device and associated methods, allowing a fast, accurate and reliable gas removal, filling and sealing of a two-phase cooling device, for instance of a heat pipe that is integrated within a PCB. A device following one of the embodiments of the invention described, also notably has the advantage of allowing integrating the phases of gas removal, filling and sealing of a cooling device as part of a usual electronics manufacturing process, thus being well adapted for volume production and mass-market applications.

Another advantage of the current invention is that it is very cost effective.

Another advantage of some embodiments of the current invention is that it allows easy reworking or repairing of a PCB.

For that purpose, the current invention proposes a system for fast and accurate filling comprising a two-phase cooling device, comprising a binding device intended to be hermetically mounted onto the two-phase cooling device and a filling tool, the binding device comprising a through-hole able to be in fluid contact with the cooling device, said through-hole being extending between a lower surface adapted to the cooling device surface, and an essentially plane upper surface, the device being characterized in that it further comprises a gripping head essentially level with said upper surface, said gripping head allowing for the filling tool to be put in hermetic contact with said upper surface, said filling tool comprising a head adapted for being put in hermetic contact with said upper surface, the head comprising an essentially tubular main conduit adapted to said through-hole, the filling tool further comprising gripping means adapted to grip said gripping head and further comprising a filling pathway formed by capillary channels in fluid communication with said tubular main conduit, the filling tool further comprising filling means controlling the delivery of a working fluid towards the through-hole through said filling pathway.

In an exemplary embodiment of the invention, the two-phase cooling device can be a heat pipe.

In an exemplary embodiment of the invention, the heat pipe can be integrated in a printed circuit board or PCB.

In an exemplary embodiment of the invention, the binding device can be soldered onto the surface of the PCB.

In an exemplary embodiment of the invention, the binding device can be part of the two-phase cooling device's structure.

In an exemplary embodiment of the invention, the binding device can be soldered onto the cooling device.

In an exemplary embodiment of the invention, the binding device can further comprise a pin-shaped plug, said through-hole being adapted to be hermetically closed by said pin-shaped plug through forced insertion.

In an exemplary embodiment of the invention, said pin-shaped plug can be essentially of conical shape, said through-hole being essentially of cylindrical shape.

In an exemplary embodiment of the invention, said pin-shaped plug can be essentially of cylindrical shape, said through-hole being essentially of conical shape.

In an exemplary embodiment of the invention, said pin-shaped plug can be essentially of conical shape, said through-hole being also essentially of conical shape.

In an exemplary embodiment of the invention, said gripping head can be formed by a shoulder.

In an exemplary embodiment of the invention, said gripping means can comprise pliers having arms adapted to the profile of the gripping head, the pliers being actuated through a first lever.

In an exemplary embodiment of the invention, the system for fast and accurate filling can further comprise a filling pathway in fluid communication with said tubular main conduit, the filling tool further comprising filling means controlling delivery of a working fluid towards the through-hole through said filling pathway.

In an exemplary embodiment of the invention, said filling means can comprise at least one zero-dead volume valve comprising an upper house, a lower house and a flexible layer disposed in-between, the upper house comprising a central channel allowing conveying a driving gas injected therethrough, one end of the central channel being extending up to the flexible layer, the lower house comprising one first capillary tube forming a working fluid inlet, and one second capillary tube forming a working fluid outlet, one end of each of the two capillary tubes extending up to the flexible layer, the flexible layer allowing working fluid to flow through the first capillary tube and the second capillary tube when it is depressed by releasing pressure of the injected driving gas.

In an exemplary embodiment of the invention, said filling means can comprise two zero-dead volume valves disposed in series, each valve having its first capillary tube in fluid communication with a respective fluid injection device, and its central channel associated with a respective valve controlling the injection of the driving gas.

In an exemplary embodiment of the invention, the system for fast and accurate filling can further comprise a vacuum pathway in fluid communication with said tubular main conduit, the filling tool further comprising vacuum means controlling the removal of gas contained in the two-phase cooling device through said vacuum pathway.

In an exemplary embodiment of the invention, the system for fast and accurate filling can further comprise insertion means allowing forced insertion of the pin-shaped plug into said through hole.

In an exemplary embodiment of the invention, the insertion means can comprise an insertion head receiving said pin-shaped plug, the insertion head further comprising a holding device allowing for the pin-shaped plug to be maintained held by means of friction when not inserted in said through-hole.

In an exemplary embodiment of the invention, said holding device can be formed by a snake tongue, the pin-shaped plug comprising a hole realized within its upper part, and adapted for receiving said snake tongue.

Figure 2:
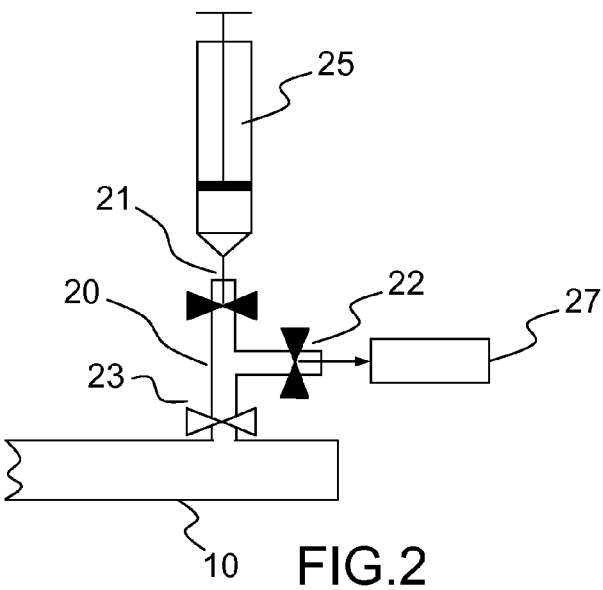
Figure 3:
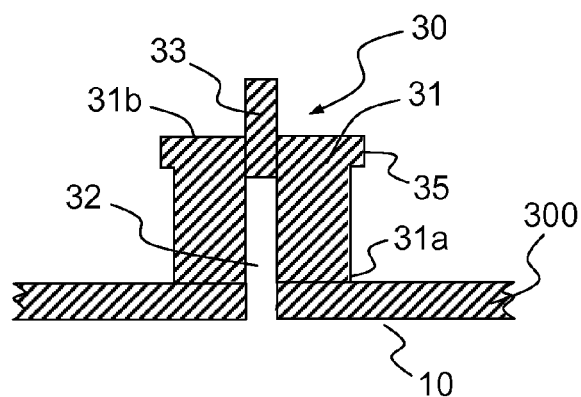
Figure 4:
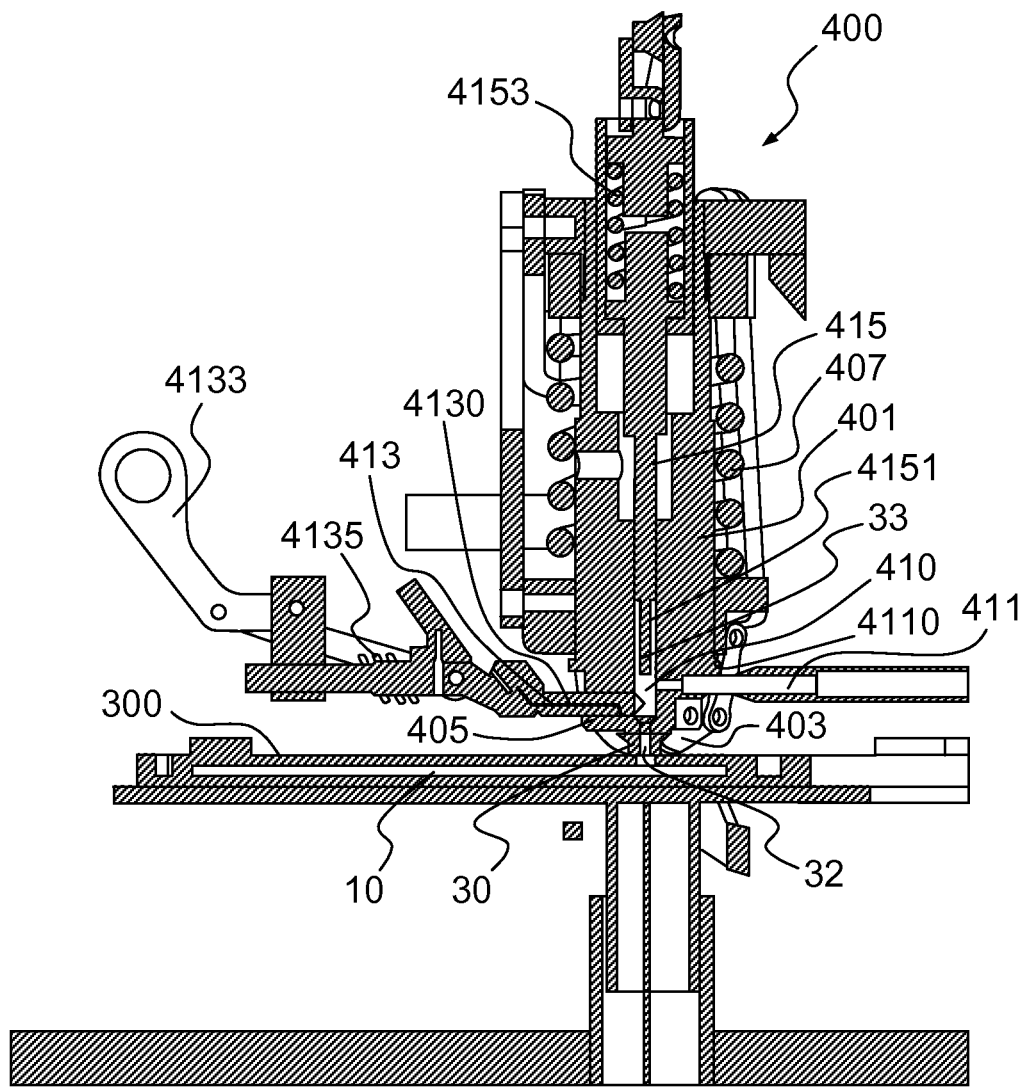
Figure 5:
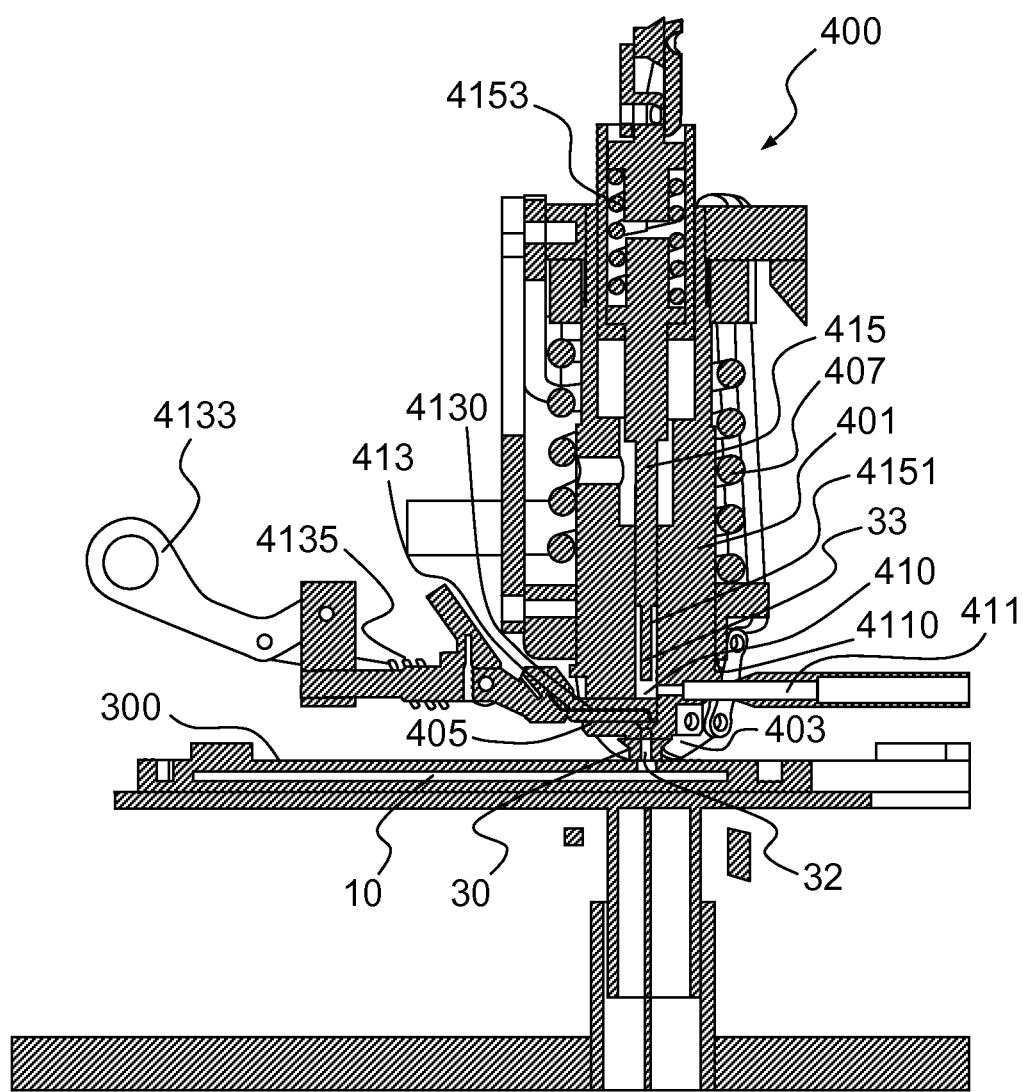
Figure 6:
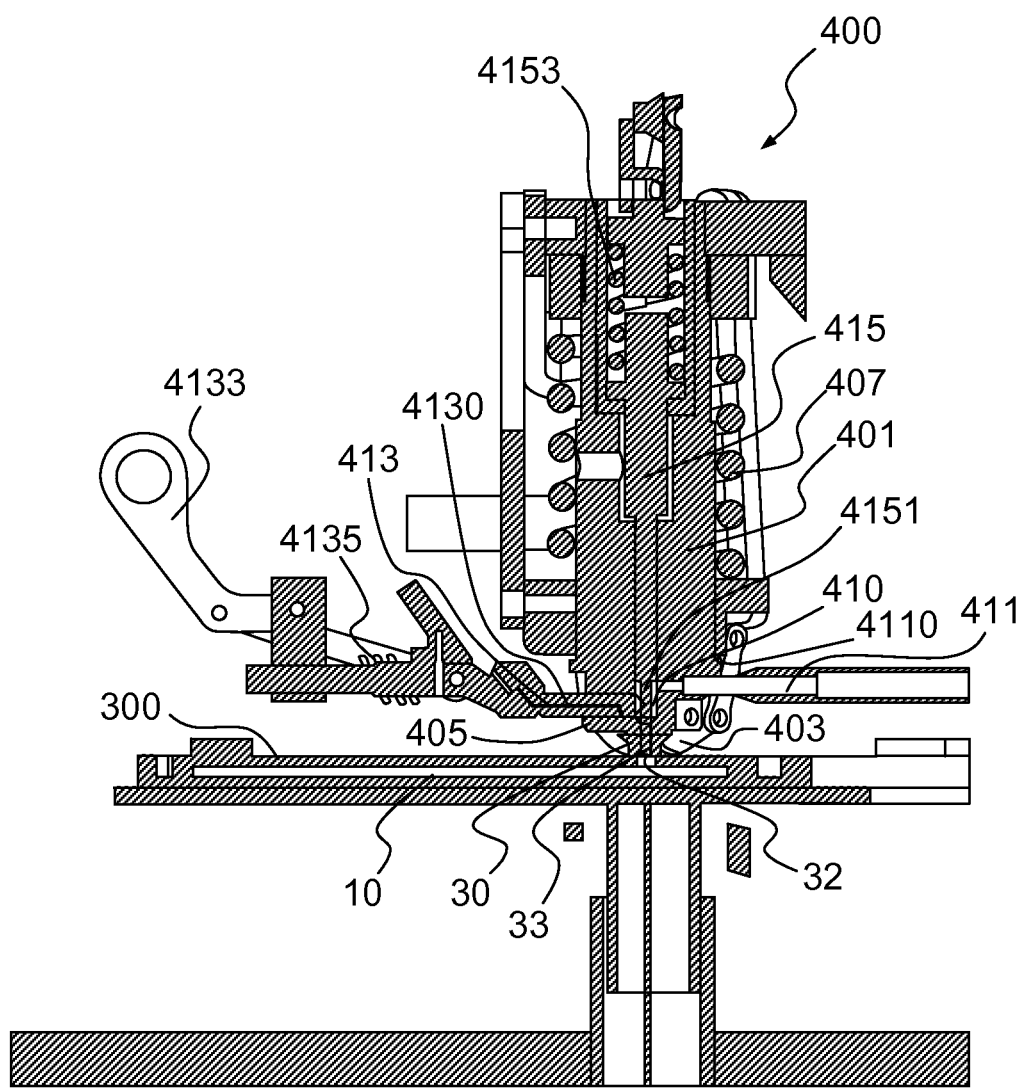
Figure 9:
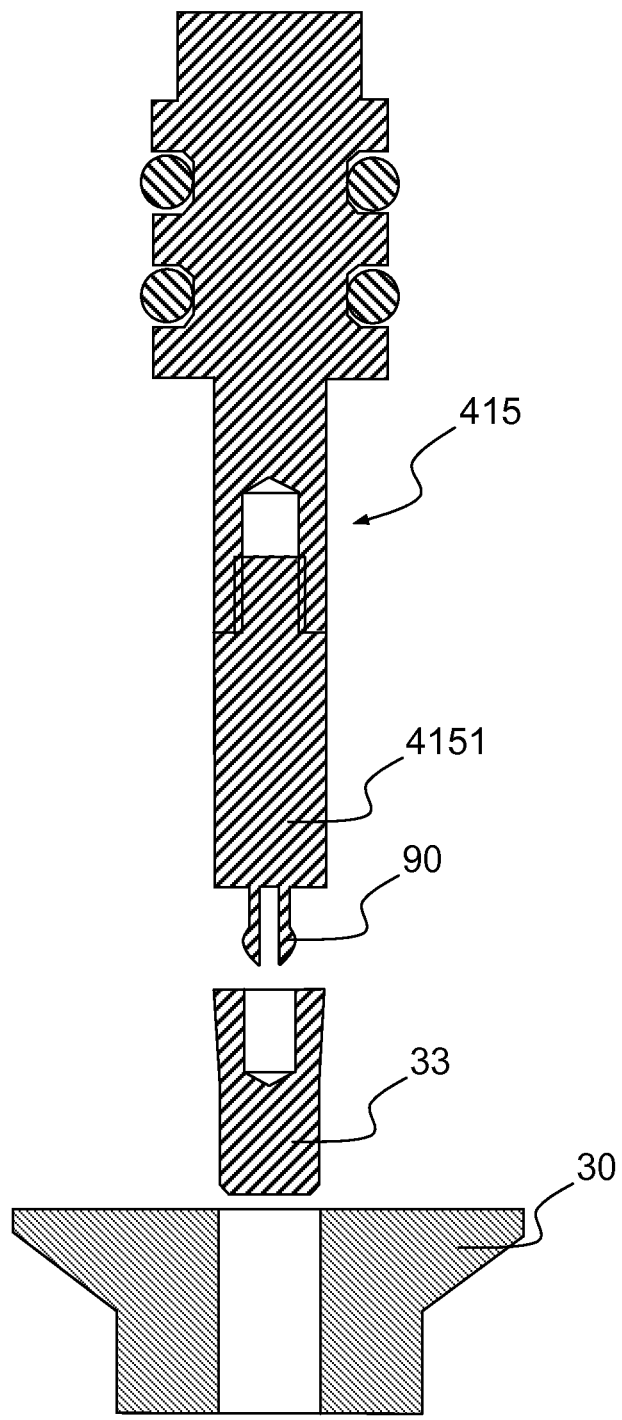

These and other characteristics and advantages of the invention will be made clearer in view of the detailed description given below of a preferred embodiment, provided by way of an illustrative and non-limiting example only, as well as the accompanying drawings which represent:

FIG. 1, a perspective view illustrating the operating principle of a heat pipe;

FIG. 2, a synoptic view illustrating the principle of an apparatus allowing gas removal, filling and sealing of a heat pipe;

FIG. 3, a section view illustrating a device for fast and accurate filling of a heat pipe, according to an embodiment of the invention;

FIG. 4, a section view illustrating a filling tool used in heat pipe, during a phase of gas removal from the heat pipe, following an embodiment of the invention;

FIG. 5, a section view illustrating a filling tool used in combination with a device for fast and accurate filling of a heat pipe, during a phase filling the heat pipe with a working fluid, following an embodiment of the invention;

FIG. 6, a section view illustrating a filling tool used in combination with a device for fast and accurate filling of a heat pipe, during a phase of sealing of the heat pipe, following an embodiment of the invention;

FIGS. 7a and 7b, section views illustrating dosing means for controlling the amount of working fluid, in a device for fast and accurate filling of a heat pipe, during a phase of filling of the heat pipe, following an embodiment of the invention;

FIG. 8, a synoptic view illustrating dosing means for controlling the amount of working fluid, in a device for fast and accurate filling of a heat pipe, during a phase of filling of the heat pipe, following an embodiment of the invention;

FIG. 9, a section view illustrating a holding device being part of the insertion means, following an exemplary embodiment of the invention.

FIG. 1 shows a perspective view illustrating the operating principle of a heat pipe. A heat pipe 10 is shown in the illustrated example as a simple tubular component contained within an external structure 11 forming a container. The internal of the heat pipe 10 comprises a wick 12 forming a capillary network, level with the internal side of the external structure 11, and also comprises an internal cavity that is containing a working fluid. In the illustrated example, the left part of the heat pipe 10 forms an evaporator 13, which is the part of the heat pipe 11 that is in the vicinity of heat radiating components, not shown in the figure. The right part of the heat pipe 10 forms a condenser 14. Level with the evaporator 13, the working fluid evaporates to vapour, thus absorbing thermal energy. The vapour migrates along the internal cavity towards the condenser 14. The vapour then condenses back to liquid form, and is absorbed by the wick 12, releasing thermal energy. The working fluid flows back towards the evaporator 13 through the wick 12. The presence of a coolant in two phases is specific to two-phase cooling devices, which are not limited to heat pipes, and to which the current invention may equally apply, though only exemplary embodiments involving a heat pipe are described below.

FIG. 2 shows a synoptic view illustrating the principle of an apparatus allowing gas removal, filling and sealing of a heat pipe. A heat pipe 10, similar to the heat pipe 10 described above in reference to FIG. 1, is partly shown in FIG. 2. The heat pipe 10 can comprise a protruding part 20, for example made in the same material as the external part of the heat pipe 10, for example of a soft metallic material. The protruding part 20 can be connected to both filling means 25 allowing injecting the working fluid into the heat pipe 10, and to vacuum means 27, allowing gas removal prior to filling of the heat pipe 10. The filling means 25 can for example be formed by a microdosing device, such as a micro-syringe, and the vacuum means 27 can be formed by a pump. The filling means 25 and vacuum means 27 can be connected to the protruding part respectively through a filling pathway and a vacuum pathway, for example formed by two openings of the protruding part 20. The protruding part 20 can for example comprise a bifurcation, and form a T-shaped part. The successive phases of gas removal from the heat pipe 10, and filling, can be accomplished by means of actuating a first valve 21 controlling the working fluid injection level with the filling pathway, and a second valve 22 controlling the vacuum level with the vacuum pathway.

FIG. 3 shows a section view illustrating a device for fast and accurate filling of a heat pipe, according to an embodiment of the invention.

According to a specificity of the current invention, an intermediate part is intended to facilitate the process of gas removal, filling of the heat pipe, and sealing thereof. This intermediate part, hereinafter referred to as "binding device" can be part of the two-phase cooling device it is associated with, or hermetically mounted thereon, or for instance hermetically mounted on a PCB containing an integrated heat pipe, as described in the exemplary embodiments hereinafter. It shall be noted that the invention shall not be limited to the use of a printed circuit board, and shall similarly apply to any other device or component likely to be used jointly with a heat pipe. As shown in the example illustrated by FIG. 3, a binding device 30 comprises a body 31, for example presenting a rotational symmetry around a central axis, a lower surface 31a adapted to be fitted and hermetically mounted onto the surface, for example of a PCB 300. The binding device 30 can for example be soldered to the PCB surface. Thus, in such an embodiment of the invention, the binding device 30 can be processed as any other type of surface mounted device or component, and mounting can be realized in a regular PCB production line, as part of a regular manufacturing process. The binding device 30 also comprises an upper surface 31b, essentially plane. A through-hole 32 is realized, essentially along the central axis, the through hole being adapting for conveying removed gasses and working fluid when need be, as further described. The through-hole can be aligned with a hole realized in the PCB 300.

According to a specificity of the current invention, the binding device 30 further comprises a gripping head 35, essentially level with the upper surface 31b. The gripping head 35 allows for a multi-purpose tool, hereinafter referred to as filling tool, to be put in hermetic contact with the upper surface 31b of the binding device 30. The filling tool is not shown on FIG. 3, and is described in more details hereinafter, in reference to FIGS. 4 to 6. The gripping head 35 can for example be formed by a shoulder, whose profile is designed so as to be optimally fitted to the filling tool, as described further below in reference to FIG. 4. It is to be observed that the gripping head 35 may also have other profiles, such as a shoulder with a right-angle profile, as illustrated in the figure, or a shoulder with a slanted angle. The gripping head 35 may also be threaded so as to allow a threaded connection. The gripping head 35 also allows easy centering and aligning of the filling tool with the through-hole 32.

A binding device 30 according to any embodiment of the invention has the advantage of being adapted for being handled through automated pick-and-place techniques, without any specific modification of existing report and welding processes.

According to an embodiment of the current invention, sealing of the heat pipe can be achieved through sealing of the binding device 30, thanks to a counterpart, hereinafter referred to as a pin-shaped plug 33. The pin-shaped plug 33 can be inserted in the through-hole 32 by forcing it down thereinto. Thus, once the pin-shaped plug 33 and the body 31 of the binding device 30 have been force assembled one with the other, a cold weld is formed, resulting in a quick and reliable seal, even on a long term perspective. For example, the pin-shaped plug 33 can be of conical shape, to be inserted by force into the through-hole 32, the latter being for example essentially of cylindrical shape. In another embodiment, the pin-shaped plug 33 can reciprocally be of cylindrical shape, and the through-hole 32, of conical shape. In another embodiment, the pin-shaped plug 33 and through-hole 32 may be both of essentially conical shapes. Other designs may be resorted to: for example, the pin-shaped plug 33 may be replaced by a disk-shaped plug to be inserted in a recessed chamber of the through-hole 32.

One other advantage of the current invention is that the binding device body 31 and the pin-shaped plug 33 can both be made very cost efficient through mass production systems.

The current invention also relates to the filling tool referred to above and described further into details hereafter, in reference to FIGS. 4 to 6. The filling tool can be designed so as to allow carrying out the three phases of gas removal, filling with working fluid, and sealing of the heat pipe, these three phases are illustrated respectively by FIGS. 4, 5 and 6 described below.

FIG. 4 shows a section view illustrating a filling tool used in combination with a device for fast and accurate filling of a heat pipe, during a phase of gas removal from the heat pipe, following an embodiment of the invention.

The PCB 300 incorporating a heat pipe 10 can be fixed on a support table. A filling tool 400 comprises a body 401 and a central main axis along which is realized a main conduit 410, essentially of tubular shape. The filling tool 400 also comprises a head 405, whose external surface is adapted to the upper surface of the binding device 30 described below in reference to FIG. 3, and also shown in FIG. 4. The main conduit 410 is extending up to the external surface of the head 405, level with which it is aligned with the through-hole 32 of the binding device 30, so that when the head 405 and the upper surface of the binding device 30 are in contact with each other, a fluid communication can be established between the main conduit 410 and the through-hole 32, hence with the heat pipe 10.

The filling tool 400 comprises gripping means 403, for example comprising pliers whose arms are adapted to the profile of the gripping head 35 of the binding device 30. The pliers forming the gripping means 403 can for example be put in their gripping configuration through a dedicated first lever, not shown on the figure, driven by an operator, and for instance rotating around a transverse axis. It is to be noticed that the pliers can be actuated by any kind of automated actuator. The gripping means 403 can be associated with first return means, for example formed by a first return spring 407 whose main axis is aligned with the central main axis of the filling tool 400. The gripping means allow firmly gripping the gripping head 35, thus realizing a hermetic connection between the head 405 and the gripping head 35, while not stressing the junction between the PCB 300 and the binding device 30.

The filling tool 400 further comprises vacuum means 411, said vacuum means 411 comprising at least a vacuum pathway 4110 in fluid communication with the main conduit 410. In the illustrated example, the vacuum pathway 4110 can be formed by a first transverse hole realized in the body 401 and extending up to the main conduit 410. The vacuum can for example be realized by means of a vacuum pump connected to the vacuum means 411 or being part thereof. The vacuum pump can for example be turned on and off by an operator, and can for example be associated with a vacuum control valve, as described further in reference to FIG. 8. It is to be noticed that the vacuum pump can also be turned on and off by means of an automated actuator.

The filling tool 400 further comprises filling means 413, said filling means 413 comprising at least a filling pathway 4130 which can be put in fluid communication with the main conduit 410 by means of switching means. In the illustrated example, the filling pathway 4130 can be formed within a moving part having a translation movement along a second transverse hole realized in the body 401 and extending up to the main conduit 410. The filling means 413 can have a first position in which it is retracted, for example through the second transverse hole so as not to obstruct the main conduit 410, and a second position in which an end part of the internal filling pathway 4130 is aligned with the main conduit 410, the though-hole 32 and hence the heat pipe 10. Translation of the moving part can be realized by an operator, for example through driving a dedicated second lever 4133 rotating around a transverse axis, the second lever 4133 being for example associated with second return means 4135 which can be formed by a second return spring. It is to be noticed that translation of the moving part can also be realized by means of any kind of automated actuator.

Filling of the heat pipe 10 can for example be realized by means of dosing means connected to the filling means 413 or being part thereof. The dosing means can comprise a micro-syringe, or can advantageously be designed so as to provide an improved accuracy, as in exemplary embodiments described hereafter in reference to FIGS. 7a, 7b, 8a and 8b. The dosing means can be controlled by an operator, or by means of an automated device.

The filling tool 400 further comprises insertion means 415 allowing forced insertion of the pin-shaped plug 33 described above in reference to FIG. 3. The insertion means 415 notably comprise an insertion head 4151 receiving the pin-shaped plug 33 as described above in reference to FIG. 3. The pin-shaped plug 33 can be held by means of a holding device comprised in the end of the insertion head 4151. An example of a holding device is illustrated by FIG. 9 and described hereafter. The insertion means 415 can be translated along the central main axis, from a rest position to an extended position where the pin-shaped plug 33 is inserted by force into the through-hole 32 of the binding device 30, as illustrated by FIG. 6. The insertion means 415 can for example be actuated by an operator, by means of a third lever, not shown in FIG. 4, rotating around a transverse axis, and possibly associated with third return means 4153 for example formed by a third return spring. It is to be noticed that the insertion means 415 can equally be actuated by means of any kind of automated actuator.

The configuration shown in FIG. 4 corresponds to a phase of gas removal from the heat pipe 10. In this configuration, the moving part comprising the filling pathway 4130 are in their first position, which is a nominal position. The vacuum means 411 are activated, until gasses are removed from the heat pipe. Then an operator, for example, or any kind of automated actuator, may switch off the vacuum means, and enter into the filling phase, corresponding to a system configuration illustrated by FIG. 5.

As shown in FIG. 5, during the filling phase, the operator, or any kind of automated device, can actuate the second lever 4133 so as to put the moving part comprising the filling pathway 4130 to its second position, wherein the filling pathway 4130 is aligned with the through-hole 32 of the pin-shaped plug 33. Dosing means, for example, can then be activated so that the appropriate dose of working fluid can be injected into the heat pipe 10. Once the appropriate amount of working fluid has been injected, the operator, or any kind of automated device, can then enter into the sealing phase, corresponding to a system configuration illustrated by FIG. 6.

As illustrated by FIG. 6, the moving part comprised in the filling means 413 can be put back to its first-nominal-position, thanks to an action by the operator, or by any kind of automated actuator, on the second lever 4133, for instance. The operator, or automated actuator, can then proceed to force insertion of the pin-shaped plug 33, by actuating the third lever.

FIGS. 7a and 7b show section views illustrating dosing means for controlling the amount of working fluid, in a device for fast and accurate filling of a heat pipe, during a phase of sealing of the heat pipe, following an embodiment of the invention.

As illustrated by FIGS. 7a and 7b, dosing means can comprise a special zero-dead volume valve 70 comprising an upper house 71 and a lower house 73. The lower house 73 comprises two capillary tubes 73a, 73b, one first capillary tube 73a forming a working fluid inlet, and one second capillary tube 73b forming a working fluid outlet. The first capillary tube 73a can be connected to a working fluid injection device, for example a syringe, and the second capillary tube 73b can be in fluid communication with the filling pathway 4130 comprised in the filling means 413 described above in reference to FIGS. 4 to 6. It shall be observed that according to the present invention, accuracy of the filling phase is obtained thanks to the capillary nature of the channels conveying working fluid, in opposition to the channels for evacuation which ideally have to be as large as possible. Moreover, another advantage of the invention is that it allows going back from one given step to another, that is, for instance: freely alternate between evacuation and filling phases on demand. This advantage is accomplished by the use of the separate zero-dead-volume valves allowing the use of the pin-shaped plug merely as a sealing device.

The upper house 71 comprises a central channel 71a allowing conveying a driving gas under pressure, for example nitrogen N2.

A flexible layer 75 is disposed in-between the upper house 71 and the lower house 73, the central channel 71a and the two capillary tubes 73a, 73b having one end level with the flexible layer 75. The special configuration of the zero-dead volume valve 70 allows driving the flow of working fluid, by opening the valve through releasing the pressure of the driving gas, resulting in depressing the flexible layer 75.

As illustrated in FIG. 7a, when the driving gas is injected under pressure through the central channel 71a, the flexible layer 75 is designed so as to obstruct the two capillary tubes 73a and 73b, preventing the working fluid to flow therethrough.

As shown in FIG. 7b, when the driving gas pressure is released, or when the driving gas is not injected, the flexible layer 75 allows the working fluid to flow through the capillary tubes 73a, 73b. One advantage provided by the capillary tubes lies in the fact that the volume of fluid contained therein is very small and they allow for a precise prediction of the amount of fluid they contain, thereby allowing for an accurate filling process.

In an advantageous embodiment of the current invention, two working fluid injection devices can be used, each being associated with a zero-dead volume valve 70, as described hereafter in reference to FIG. 8, which shows a synoptic view illustrating dosing means for controlling the amount of working fluid, in a device for fast and accurate filling of a heat pipe, during a phase of filling of the heat pipe, following an embodiment of the invention.

As illustrated by FIG. 8, the filling means, connected with the heat pipe 10 through a binding device not shown in this figure, can comprise dosing means 80 comprising a first fluid injection device allowing accurate dosing of a fluid, for example a first syringe Sa, in series with a second fluid injection device, for example a second syringe Sb. The first syringe Sa can be associated with a first zero-dead volume valve 70a similar to the zero-dead volume valve 70 described above in reference to FIGS. 7a and 7b, and the second syringe Sb can be associated with a second zero-dead volume valve 70b. The central channel of the two zero-dead volume valves 70a and 70b can be connected to a driving gas injection device, for example through two respective valves V1 and V2, allowing controlling the driving gas injection, i.e. turning the driving gas injection on or off. The two syringes Sa and Sb and their associated valves can be used in combination, the first syringe Sa providing allowing for example a higher flow and a lower accuracy, compared to the second syringe Sb, the latter being operating as a buffer dosing means. The first synringe Sa supplies working fluid to the second syringe Sb, which is typically smaller and more accurate.

The vacuum means can for example comprise a vacuum control valve V0, the vacuum being for example realized by means of a turbo-pump 82 associated with a roughing pump 84, as shown in the exemplary embodiment illustrated by FIG. 8. The roughing pump 84 allows reaching a lower vacuum state, i.e a higher quality vacuum.

FIG. 9 is a section view illustrating an example of a holding device being part of the insertion means 415 described above in reference to FIG. 4.

A holding device 90 can for example be formed by a snake tongue, with two ends holding the pin-shaped plug 33 through a friction effect. To that end, a hole can be realized within the upper part of the pin-shaped plug 33. The holding device can be part of the insertion head 4151 tip, which can be easily removable, so as to be replaced if need be.

It shall be observed that, though the present description applies to accurate filling of a heat pipe, that the embodiments of the invention described therein can also be applied to filling of any closed vessels requiring fast, accurate and possibly automated fluid filling, following single-phase or two-phase processes.

The invention claimed is:
1. A system for filling
   a two-phase cooling device with a working fluid, comprising a binding device, wherein said binding device comprises a lower surface hermetically mounted onto a surface of said cooling device and an essentially plane upper surface, wherein the binding device comprises a through-hole in fluid communication with the cooling device, said through-hole extending between said lower surface and said upper surface, characterized in that the system further comprises a filling tool comprising a head having an external surface in contact with said upper surface of,
   the binding device and an essentially tubular main conduit adapted to said through-hole and extending up to the external surface of the head of said filling tool,
   the binding device further comprises a gripping head adapted to put said external surface of the head of said filling tool in hermetic contact with the upper surface of said binding device while aligning the head of the filling tool with the through-hole so that a fluid communication is established between said main conduit and the through-hole,
   the filling tool further comprising
   a filling pathway formed by capillary channels in fluid communication with said tubular main conduit,
   the filling tool further comprising filling means controlling the delivery of said working fluid towards the through-hole through said filling pathway.
2. The system for filling a two-phase cooling device as claimed in claim 1, wherein the two-phase cooling device is a heat pipe.

3. The system for filling a two-phase cooling device as claimed in claim 2, wherein the heat pipe is integrated in a printed circuit board or PCB.

4. The system for filling a two-phase cooling device as claimed in claim 3, wherein the binding device is soldered onto the surface of the PUB.

5. The system for filling a two-phase cooling device as claimed in claim 1, that wherein the binding device is part of the two-phase cooling device's structure.

6. The system for filling a two-phase cooling device as claimed in claim 1, wherein, the binding device is soldered onto the cooling device.

7. The system for filling a two-phase cooling device as claimed in claim 1, wherein the filling tool further comprises a plug, said plug being configured to be forced inserted into the through-hole of said binding device.

8. The system for a two-phase cooling device filling as claimed in claim 7, wherein said plug is a pin-shaped plug being essentially of conical shape, said through-hole being essentially of cylindrical shape.

9. The system for filling a two-phase cooling device as claimed in claim 7, wherein said plug is a pin-shaped plug being essentially of cylindrical shape, said through-hole being essentially of conical shape.

10. The system for filling a two-phase cooling device as claimed in claim 7, wherein said pin-shaped plug is a pin-shaped plug being essentially of conical shape, said through-hole being also essentially of conical shape.

11. The system for filling a two-phase cooling device as claimed in claim 1, wherein said gripping head is formed by a shoulder.

12. The system for filling a two-phase cooling device as claimed in claim 1, wherein the filling tool comprises gripping means for gripping the gripping head of said binding device so as to realize a hermetic connection between the head of the filling tool and the gripping head of said binding device.

13. The system for filling a two-phase cooling device as claimed in claim 12, wherein said gripping means comprise pliers having arms adapted to the profile of the gripping head, the pliers being actuated through a first lever.

14. The system for filling a two-phase cooling device as claimed in claim 1, wherein said filling means comprises at least one zero-dead volume valve comprising an upper house, a lower house and a flexible layer disposed in-between, the upper house comprising a central channel allowing conveying a driving gas injected there through, one end of the central channel being extending up to the flexible layer, the lower house comprising one first capillary tube forming a working fluid inlet, and one second capillary tube forming a working fluid outlet, one end of each of the two capillary tubes extending up to the flexible layer, the flexible layer allowing working fluid to flow through the first capillary tube and the second capillary tube when it is depressed by releasing pressure of the injected driving gas.

15. The system for filling a two-phase cooling device as claimed in claim 14, wherein said filling means comprises two zero-dead volume valves disposed in series, each valve having its first capillary tube in fluid communication with a respective fluid injection device, and its central channel associated with a respective valve controlling the injection of the driving gas.

16. The system for filling a two-phase cooling device as claimed in claim 1, further comprises a vacuum pathway in fluid communication with said tubular main conduit, the filling tool further comprising vacuum means for controlling the removal of gas contained in the two-phase cooling device through said vacuum pathway.

17. The system for filling a two-phase cooling device as claimed in claim 7, further comprising an insertion means allowing forced insertion of the plug into said through hole.

18. The system for filling a two-phase cooling device as claimed in claim 17, wherein the insertion means comprise an insertion head receiving said plug, the insertion head further comprising a holding device allowing for the plug to be maintained held by means of friction when not inserted in said through-hole.

19. The system for filling a two-phase cooling device as claimed in claim 18, wherein said holding device is formed by a snake tongue, the plug comprising a hole realized within its upper part, and adapted for receiving said snake tongue.

* * * * *